United States Patent
Lee et al.

(10) Patent No.: US 9,506,949 B2
(45) Date of Patent: Nov. 29, 2016

(54) SPRING PROBE

(71) Applicant: MPI CORPORATION, Chu-Pei, Hsinchu Shien (TW)

(72) Inventors: Yi-Lung Lee, Chu-Pei (TW); Horng-Kuang Fan, Chu-Pei (TW)

(73) Assignee: MPI CORPORATION, Chu-Pei, Hsinchu Shien (TW)

( * ) Notice: Subject to any disclaimer, the term of this patent is extended or adjusted under 35 U.S.C. 154(b) by 11 days.

(21) Appl. No.: 14/605,798

(22) Filed: Jan. 26, 2015

(65) Prior Publication Data
US 2015/0247882 A1    Sep. 3, 2015

Related U.S. Application Data

(60) Provisional application No. 61/932,251, filed on Jan. 28, 2014.

(51) Int. Cl.
G01R 1/067 (2006.01)

(52) U.S. Cl.
CPC ....... G01R 1/06722 (2013.01); G01R 1/06738 (2013.01)

(58) Field of Classification Search
CPC .......... G01R 1/06722; G01R 1/06738; G01R 1/06716
See application file for complete search history.

(56) References Cited

U.S. PATENT DOCUMENTS

| 6,720,511 B2 * | 4/2004 | Windebank | H01H 1/245 200/275 |
| 2011/0248736 A1 * | 10/2011 | Kato | H01R 13/2421 324/755.05 |
| 2012/0071037 A1 * | 3/2012 | Balucani | G01R 1/06716 439/851 |
| 2013/0057309 A1 * | 3/2013 | Kojima | C25D 1/02 324/755.05 |
| 2014/0028343 A1 * | 1/2014 | Numata | G01R 1/06722 324/763.01 |

FOREIGN PATENT DOCUMENTS

| DE | 102011008933 A1 | 7/2012 |
| JP | 2004-152495 A | 5/2004 |
| JP | 2007-024664 A | 2/2007 |
| JP | 2007-178403 A | 7/2007 |
| JP | 2011-053035 A | 3/2011 |
| JP | WO 2012-067077 A1 | 5/2012 |
| JP | 2013-089381 A | 5/2013 |

* cited by examiner

*Primary Examiner* — Daniel Miller
(74) *Attorney, Agent, or Firm* — Muncy, Geissler, Olds & Lowe, P.C.

(57) ABSTRACT

A spring probe includes a spring sleeve and a needle having a body located inside the spring sleeve and a head protruded out of a lower non-spring section of the spring sleeve and having a stopping block. The lower non-spring section is abutted against and fixed to the stopping block, facilitating assembly of the spring probe. A method for manufacturing the spring probe is disclosed including the steps of forming a spring sleeve having a lower non-spring section with a slot and a guiding sheet adjacent to the slot by photolithography technique, manufacturing a needle having a stopping block with a bonding pad and an engagement rib by MEMS manufacturing process, sleeving the spring sleeve onto the needle to engage the engagement rib into the slot, and fixing the guiding sheet and the needle together by reflow soldering the bonding pad.

14 Claims, 9 Drawing Sheets

SPRING PROBE

BACKGROUND OF THE INVENTION

1. Field of the Invention

The present invention relates generally to probes for probe cards and more particularly, to a spring probe and a method for manufacturing the spring probe.

2. Description of the Related Art

Upon testing semiconductor chips, a tester is electrically connected with devices under test (hereinafter referred to as the "DUTs") through a probe card, so that the tester can obtain the testing results of the DUTs by means of signal transmission and analysis. The conventional probe card is usually composed of a circuit board and a probe device, or further comprises a space transformer disposed between the circuit board and the probe device. The probe device has a plurality of probes arranged corresponding to contact pads of the DUTs, so that the contact pads can be probed by the probes at the same time.

FIG. 1 is an exploded plan view of a conventional spring probe 11 which comprises a needle 12, and a spring sleeve 13 sleeved onto the needle 12. FIG. 2 is a schematic sectional view of a probe card 14 using the spring probe 11. For the convenience of illustration, FIG. 2 is not drawn to the same scale with FIG. 1. The probe card 14 comprises a circuit board 15 and a probe device 16 having a probe seat 17 and a plurality of probes 11. For the convenience of illustration, only a small part of the circuit board 15 and the probe seat 17 and one of the probes 11 are shown in FIG. 2.

The needle 12 and the spring sleeve 13 of the probe 11 are connected in a way that a connection segment 132, which is provided near the bottom end of the spring sleeve 13, is pressed against the needle 12 and fixed to the needle 12 by welding, such as spot welding. The probe seat 17 is composed of upper, middle and lower dies 171, 172, 173; however, the probe seat 17 may be provided without such middle die 172 but composed of the upper and lower dies 171, 173 only. The probe seat 17 has a plurality of installing holes 174 provided in the assembly of the dies 171, 172, 173 (only one of the installing holes 174 is shown in FIG. 2). After the probe seat 17 is assembled completely, each probe 11 is installed into the installing hole 174 through a top surface 175 of the probe seat 17.

After the probe device 16 is assembled completely, the circuit board 15 is disposed on the top surface 175 of the probe seat 17. The top end of the spring sleeve 13 is electrically connected with a contact pad of the circuit board 15. The bottom end of the needle 12 is adapted to probe a contact pad of the DUT. Specifically speaking, the top end of the spring sleeve 13 is abutted against the circuit board 15, and the spring sleeve 13 is provided with two spring sections 138 which are compressible elastically; besides, the connection segment 132 of the spring sleeve 13 is fixed to the bottom section of the needle 12, and a clearance 18 is provided between the top end of the needle 12 and the circuit board 15, i.e. between the top end of the needle 12 and the top end of the spring sleeve 13. Therefore, when the bottom end of the needle 12 contacts the contact pad of the DUT and correspondingly feeds forward, the needle 12 will retract backward, such that the sleeve 13 will be compressed. In this way, the probe 11 can positively contact and electrically connect the contact pad of the DUT; besides, by means of the cushioning effect provided by the spring sleeve 13, an exceeding contact force, which may cause damage or heavy wear of the contact pad of the DUT or the needle, can be prevented.

However, the aforesaid conventional spring probe 11 is inconvenient in assembling. At first, when the spring sleeve 13 is sleeved onto the needle 12, the spring sleeve 13 is difficulty positioned at a predetermined position. Thereafter, the spring sleeve 13 needs to be pressed against the needle 12 and then fixed to the needle 12 by welding; such process of fixing the spring sleeve 13 to the needle 12 is time-consuming. Besides, during the aforesaid fixing process, the spring sleeve 13 is not stably positioned at the needle 12 and therefore might be displaced relative to the needle 12, resulting in difficulty in fixing the spring sleeve 13 to the needle 12.

SUMMARY OF THE INVENTION

The present invention has been accomplished in view of the above-noted circumstances. It is an objective of the present invention to provide a spring probe having a spring sleeve that can be stably positioned at a needle before being fixed to the needle, so that the spring probe is more convenient in assembling and welding.

To attain the above objective, the present invention provides a spring probe which comprises a spring sleeve and a needle. The spring sleeve has an upper non-spring section, a lower non-spring section, and at least one spring section located between the upper non-spring section and the lower non-spring section. The needle has a body located inside the spring sleeve, and a head protruded out of the spring sleeve from the lower non-spring section and having a stopping block. The lower non-spring section of the spring sleeve is abutted against and fixed to the stopping block.

As a result, in the process of assembling the spring probe, the spring sleeve can be stably positioned at the needle by a simple way that the spring sleeve is sleeved onto the needle and moved relative to the needle toward the head until the lower non-spring section is abutted against the stopping block of the needle. By this way, it will be more convenient to perform the following step of fixing the lower non-spring section to the needle, such as tight fitting the lower non-spring section to the stopping block or welding the lower non-spring section and the stopping block together.

Preferably, the stopping block of the needle may have at least one engagement rib protruded outwardly relative to the body; the lower non-spring section of the spring sleeve may have a bottom end, and at least one slot opened at the bottom end; the engagement rib of the stopping block is engaged in the slot of the lower non-spring section. In this way, the spring sleeve can be more stably positioned at the needle when being sleeved onto the needle.

Preferably, the lower non-spring section of the spring sleeve may have at least one guiding sheet adjacent to the slot; the needle may be provided with at least one reinforcing rib which is protruded outwardly relative to the body and has at least a part located at the stopping block; the guiding sheet of the lower non-spring section is positioned correspondingly to the reinforcing rib of the needle. In this way, the spring sleeve can be sleeved onto the needle in a way that the reinforcing rib is positioned correspondingly to the guiding sheet, such that the engagement rib is conveniently orientated to the slot.

In an embodiment of the present invention, the needle is shaped as an elongated rectangular column and provided with a front surface, a rear surface, and two side surfaces which are narrower than the front surface and the rear surface; the stopping block is protruded at the two side surfaces. Such needle is easily manufactured; besides, the stopping block of the needle is provided with two above-mentioned engagement ribs at two opposite positions thereof, respectively.

In another embodiment of the present invention, the needle is shaped as above mentioned; the lower non-spring section of the spring sleeve has a bottom end, and two slots opened at the bottom end; the stopping block of the needle is engaged in the two slots. In other words, the stopping block has the two engagement ribs be engaged in the two slots respectively, thereby being positioned at the needle stably. In addition, the lower non-spring section of the spring sleeve may have two guiding sheets adjacent to the two slots; the needle may be provided with two reinforcing ribs at the front surface and the rear surface respectively; at least a part of each of the reinforcing ribs is located at the stopping block; the two guiding sheets are positioned correspondingly to the two reinforcing ribs, respectively. In this way, the spring sleeve can be sleeved onto the needle in a way that the two guiding sheets are moved relative to and along the two reinforcing ribs respectively, such that the two slots are more easily orientated to the two engagement ribs, respectively.

In the case that the needle has the aforesaid reinforcing rib, the guiding sheet of the lower non-spring section may be fixed by welding to a plane of the reinforcing rib corresponding in position to the guiding sheet; in this way, the lower non-spring section is fixed to the needle conveniently and stably. Alternately, the needle may be provided with at least one bonding pad which is protruded outwardly relative to the body and located at the stopping block; the needle and the guiding sheet of the lower non-spring section are welded together by means of the at least one bonding pad; in this way, the traditional welding process can be replaced by reflow soldering the bonding pads, so that the spring probe can be made by mass production in a reduced manufacturing time.

Besides, the reinforcing rib of the needle may be extended from the stopping block to an upper end portion of the body, which is located inside the upper non-spring section of the spring sleeve, thereby improving the contact between the needle and the spring sleeve, resulting in higher stability in the signal transmission between the needle and the spring sleeve. In fact, as long as the needle is provided with at least one reinforcing rib which is protruded outwardly relative to the body and has at least a part located at the upper end portion of the body, the stability of the signal transmission between the needle and the spring sleeve is effectively improved.

It is another objective of the present invention to provide a method for manufacturing a spring probe, which can be made by mass production in effectively reduced manufacturing time.

To attain the above objective, the present invention provides a method for manufacturing a spring probe, which comprises the following steps.

a) Process a circular metal pipe to form a spring sleeve by photolithography technique in a way that the spring sleeve has an upper non-spring section, a lower non-spring section, and at least one spring section located between the upper non-spring section and the lower non-spring section. Besides, the lower non-spring section has a bottom end, at least one slot opened at the bottom end, and at least one guiding sheet adjacent to the at least one slot.

b) Manufacture a needle by MEMS manufacturing process in such a way that the needle has a body, a head connected to an end of the body, and at least one bonding pad. The head has a stopping block which is provided with at least one engagement rib protruded outwardly relative to the body. The at least one bonding pad is protruded outwardly relative to the body and located at the stopping block.

c) Position the spring sleeve at the needle in a way that the spring sleeve is sleeved onto the needle, the body of the needle is located inside the spring sleeve, the head of the needle is protruded out of the spring sleeve from the lower non-spring section, and the engagement rib of the stopping block is engaged in the slot of the lower non-spring section and abutted against the lower non-spring section.

d) Fix the needle and the guiding sheet of the lower non-spring section together by reflow soldering the at least one bonding pad.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
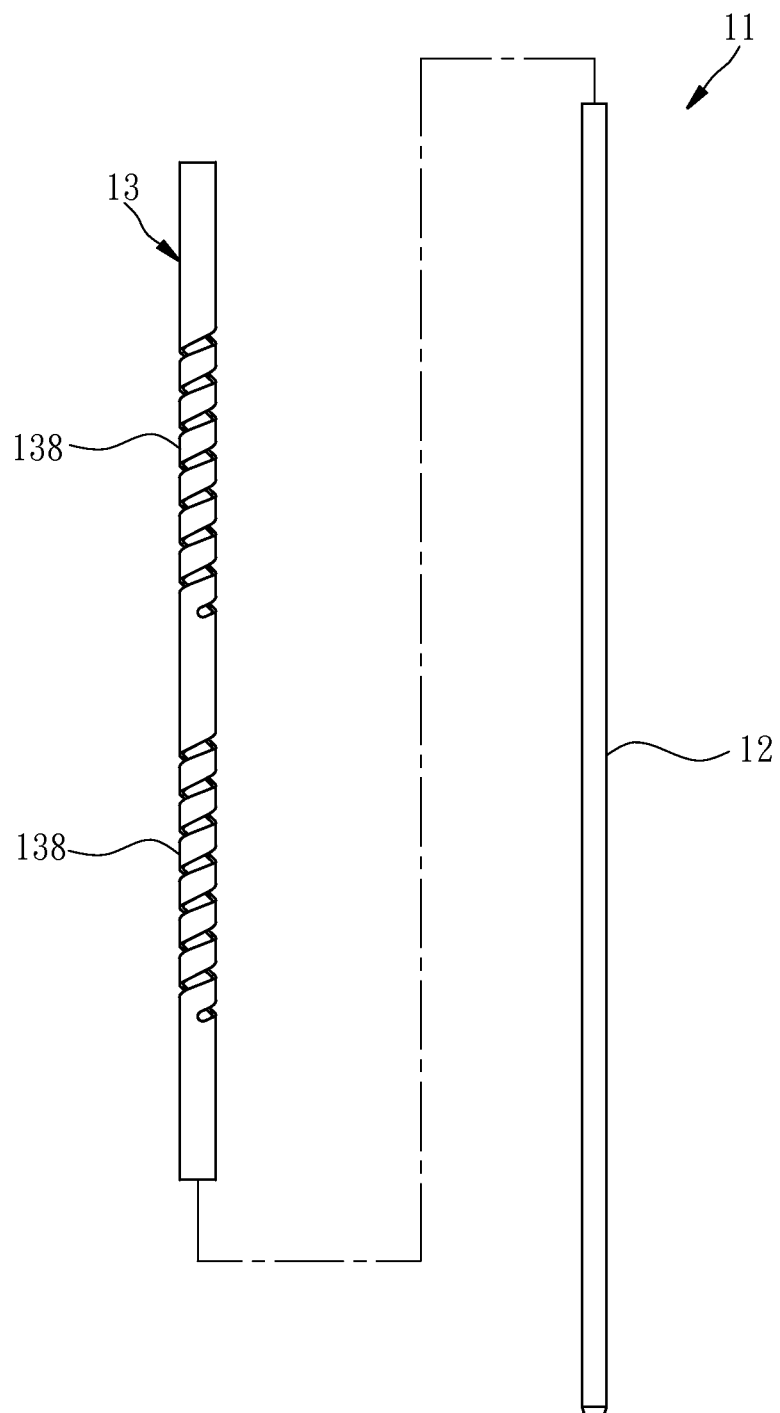
FIG. 1 is an exploded plan view of a conventional spring probe.
Figure 2:
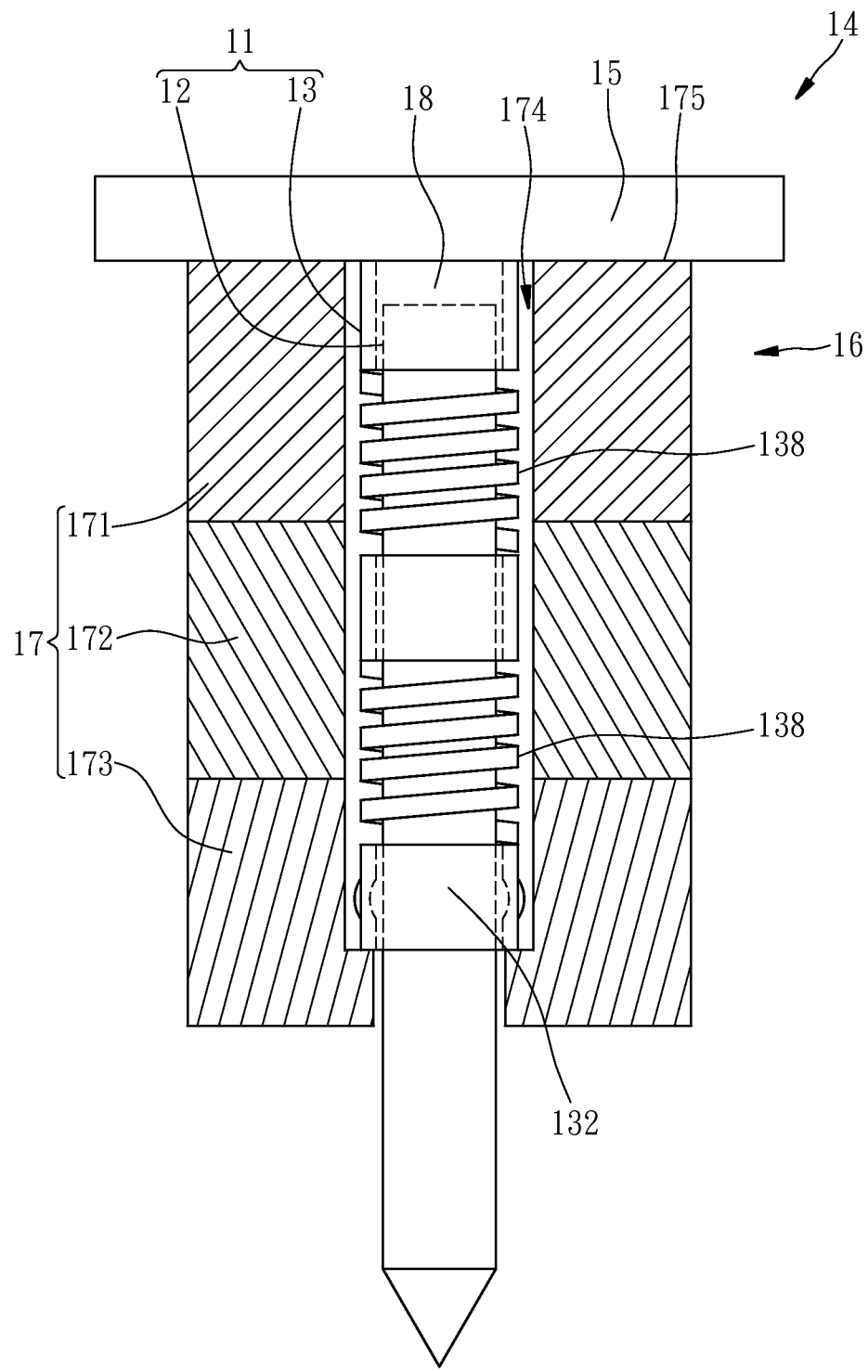
FIG. 2 is a schematic sectional view of a conventional probe card using the spring probe as shown in FIG. 1.

First of all, it is to be mentioned that same reference numerals used in the following preferred embodiments and the appendix drawings designate same or similar elements throughout the specification for the purpose of concise illustration of the present invention.

Figure 3:
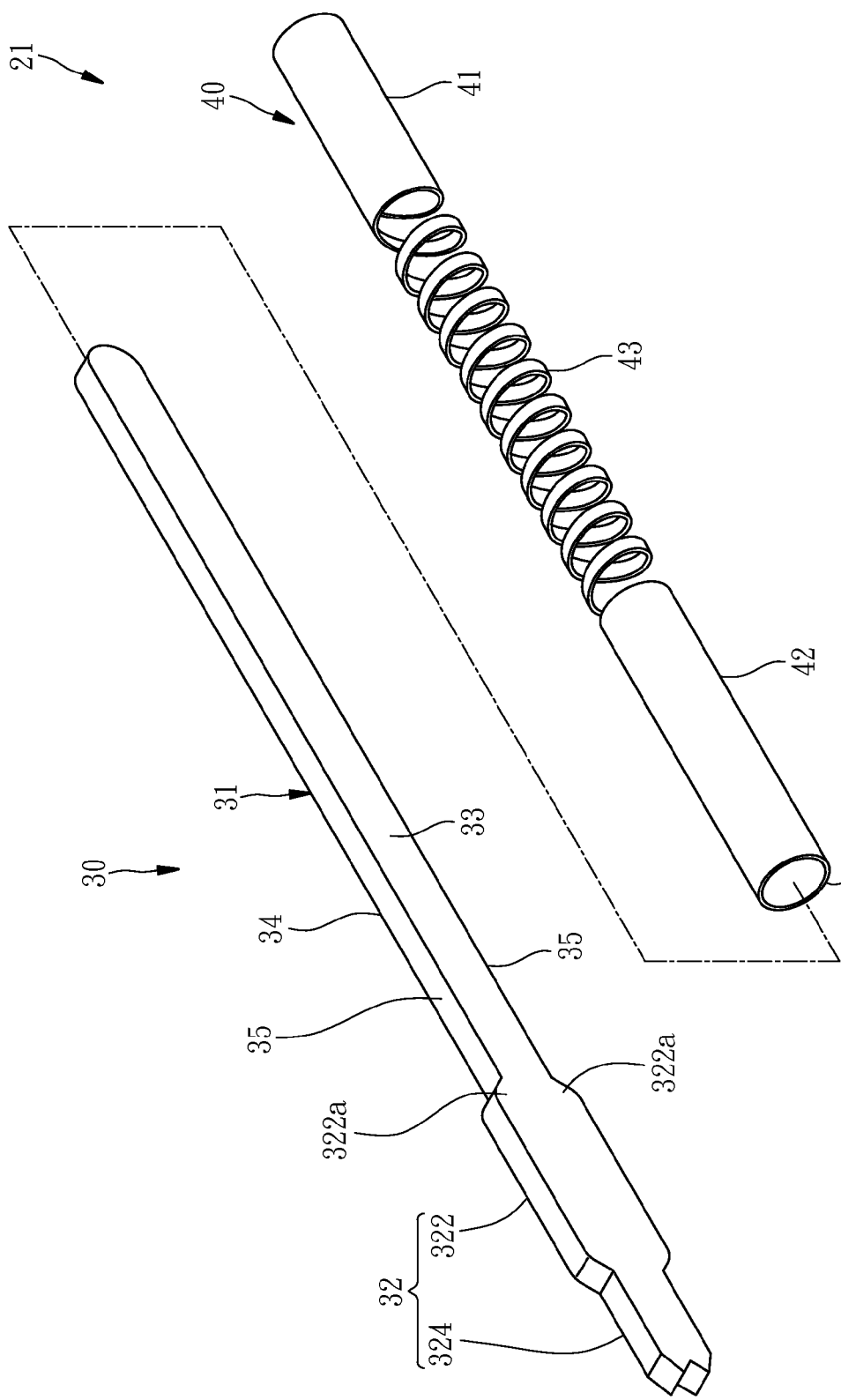
FIG. 3 is an exploded perspective view of a spring probe according to a first preferred embodiment of the present invention.
Figure 4:
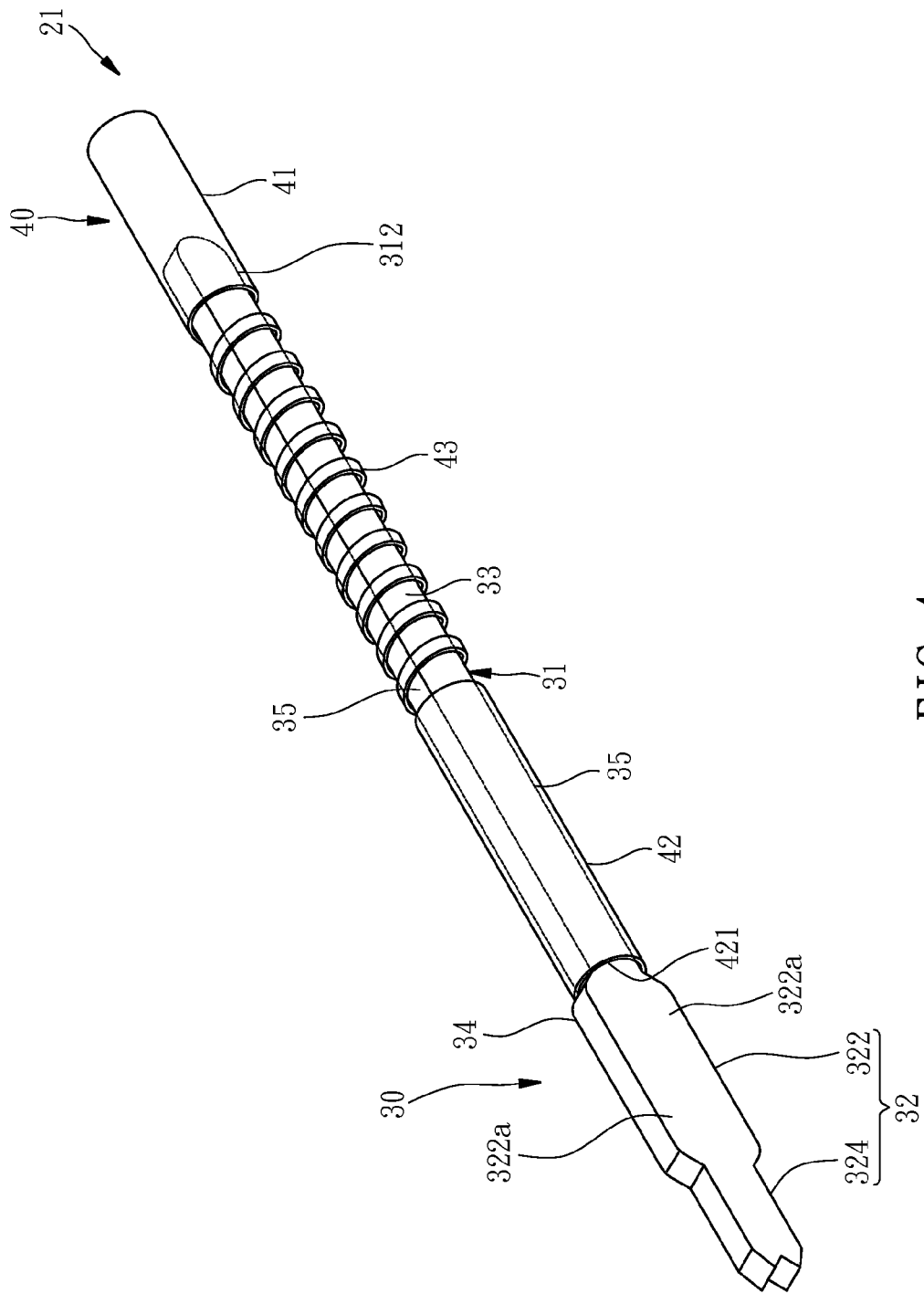
FIG. 4 is an assembled perspective view of the spring probe according to the first preferred embodiment of the present invention.

Referring to FIGS. 3-4, a spring probe 21 according to a first preferred embodiment of the present invention comprises an electricity-conductive solid needle 30, and an electricity-conductive spring sleeve 40 sleeved onto the needle 30.

The spring sleeve 40 has an upper non-spring section 41, a lower non-spring section 42, and a spring section 43 located between the upper non-spring section 41 and the lower non-spring section 42. Specifically speaking, a circular metal pipe with uniform diameter is processed by photolithography technique to form the spring sleeve 40. In other words, the spring sleeve 40 was originally a complete circular metal pipe, but now provided with the spirally opened spring section 43 by etching. The spring sleeve 40 may be provided between the upper and lower non-spring sections 41, 42 thereof with a plurality of spring sections 43 and at least one or more non-spring sections for separating the spring sections.

The needle 30 has a straight rod-like body 31, and a head 32 connected to an end of the body 31 integrally. The head 32 comprises a stopping block 322 connected with the body 31, and a probing section 324 extended from the stopping block 322 in the direction opposite to the body 31. In this embodiment, the needle 30 is made by micro-electro-mechanical systems (MEMS) manufacturing process and shaped as an elongated rectangular column with a front surface 33, a rear surface 34, and two side surfaces 35 narrower than the front and rear surfaces 33, 34. Each side surface 35 is uniform in width. The front and rear surfaces 33, 34 have same shape and approximately uniform width except that the parts thereof at the stopping block 322 are relatively wider. Therefore, the stopping block 322 is protruded at the two side surfaces 35. Specifically speaking, the stopping block 322 has two engagement ribs 322a protruded outwardly relative to the body 31 at the two side surfaces 35, respectively.

As to the process of connecting the needle 30 with the spring sleeve 40, the spring sleeve 40 is at first sleeved onto the needle 30 in a way that the lower non-spring section 42 is orientated toward the head 32, and moved toward the head 32 relative to the needle 30 until the lower non-spring section 42 is abutted against the stopping block 322. In this way, the whole body 31 of the needle 30 is located inside the spring sleeve 40, an upper end portion 312 of the body 31 is located inside the upper non-spring section 41, and the head 32 is protruded out of the spring sleeve 40 from the lower non-spring section 42. Thereafter, the lower non-spring section 42 is fixed to the stopping block 322 by a suitable way; for example, a bottom end 421 of the lower non-spring section 42 may be tight fitted to the stopping block 322; alternately, the bottom end 421 of the lower non-spring section 42 may be fixed to the stopping block 322 by welding.

Resulted from the stopping block 322 of the needle 30, in the assembling process of the spring probe 21 the spring sleeve 40 can be stably positioned at the needle 30 by a simple way that the spring sleeve 40 is sleeved onto the needle 30 and the lower non-spring section 42 is abutted against the stopping block 322. By this way, it will be more convenient to perform the following step of fixing the lower non-spring section 42 to the needle 30. Therefore, the spring probe 21 can be conveniently assembled and welded.

Figure 5:
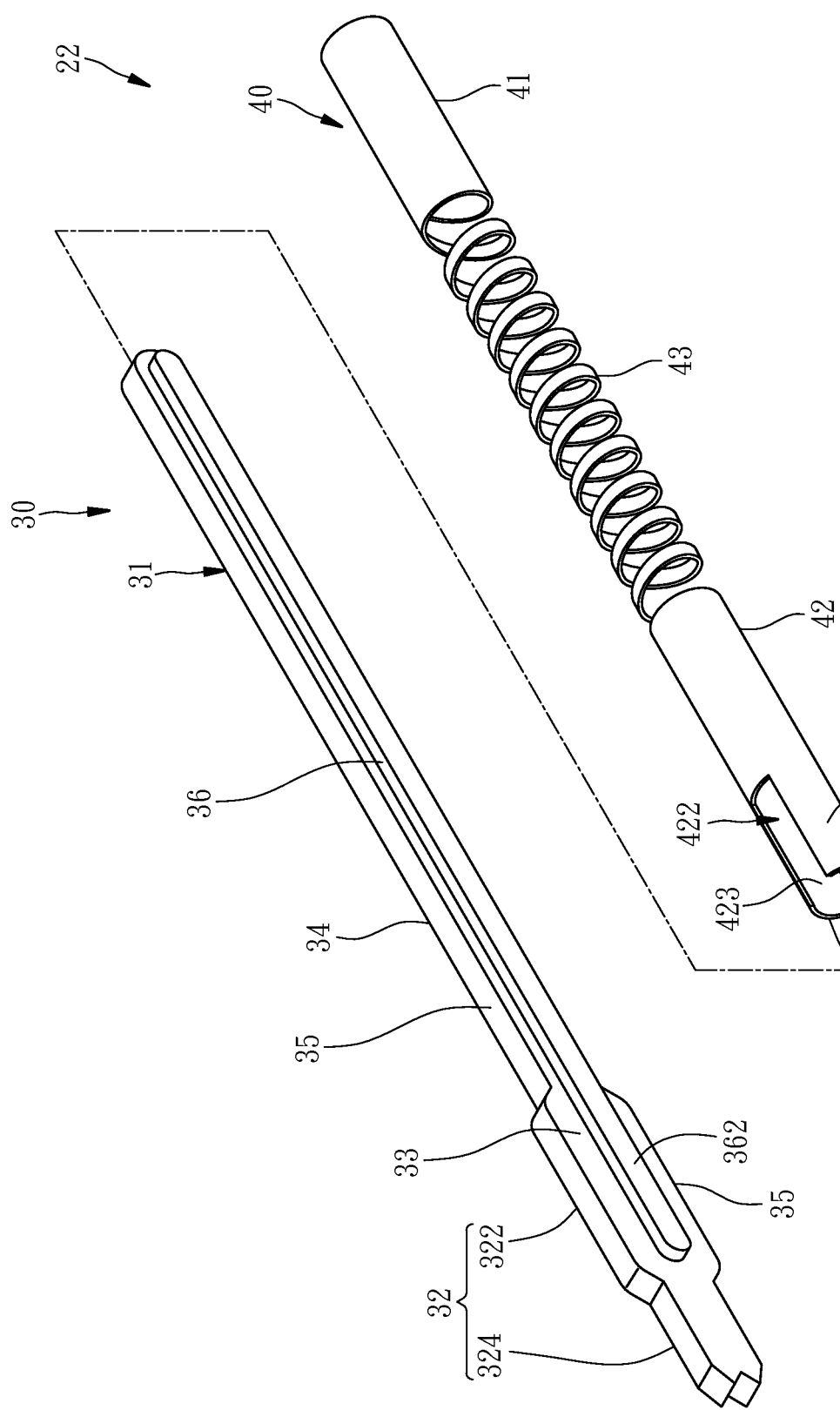
FIG. 5 is an exploded perspective view of a spring probe according to a second preferred embodiment of the present invention.
Figure 6:
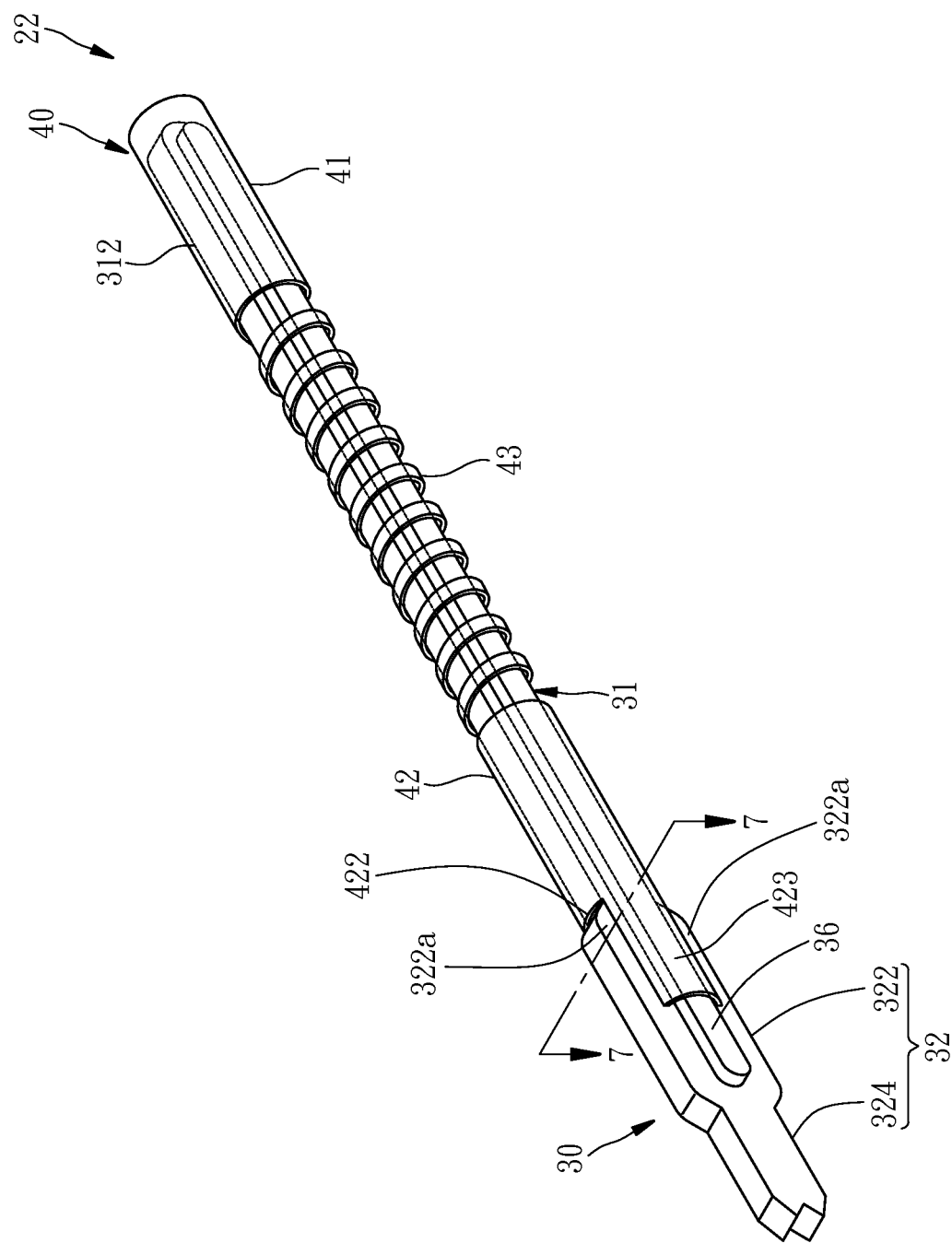
FIG. 6 is an assembled perspective view of the spring probe according to the second preferred embodiment of the present invention.
Figure 7:
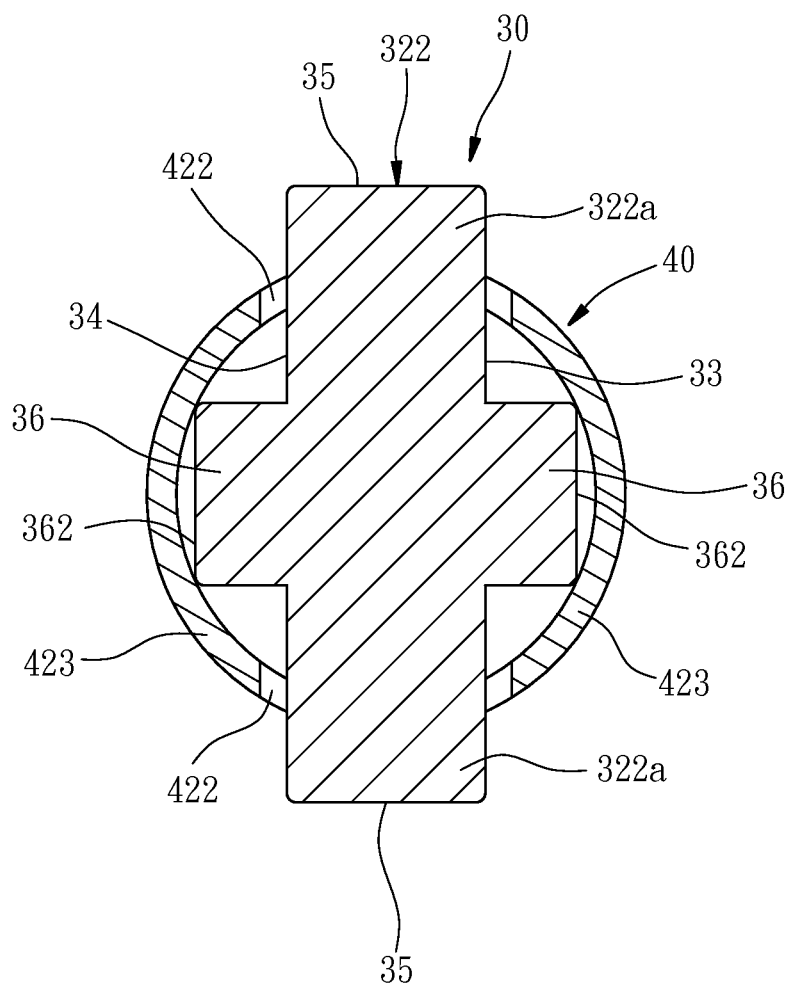
FIG. 7 is a sectional view taken along the line 7-7 in FIG. 6.

Referring to FIGS. 5-7, a spring probe 22 according to a second preferred embodiment of the present invention is configured similar to the aforesaid probe 21, except that the lower non-spring section 42 of the spring sleeve 40 in this embodiment has two slots 422 which are located at two opposite positions of the lower non-spring section 42 and opened at the bottom end 421 of the lower non-spring section 42. Besides, the needle 30 in this embodiment is provided with two reinforcing ribs 36 at the front surface 33 and the rear surface 34, respectively. Each reinforcing rib 36 has a part located at the stopping block 322 and extends from the stopping block 322 to the upper end portion 312 of the body 31.

Because the lower non-spring section 42 of the spring sleeve 40 has the two slots 422, the spring sleeve 40 can be sleeved onto the needle 30 in a way that the two slots 422 are orientated to the two engagement ribs 322a respectively, such that the stopping block 322 can be engaged in the two slots 422 and abutted against the terminals of the slots 422. As a result, in the following step of fixing the lower non-spring section 42 to the stopping block 322, the spring sleeve 40 and the needle 30 are less possibly moved relative to each other and unrotatable relative to each other. In other words, resulted from the two slots 422, the spring sleeve 40 can be more stably positioned at the needle 30, so that the probe 22 is easier in assembling and welding.

Besides, the lower non-spring section 42 has two arched guiding sheets 423 resulted from the two slots 422. The two guiding sheets 423, which are adjacent to the slots 422, are positioned correspondingly to the two reinforcing ribs 36, respectively. As a result, the spring sleeve 40 can be sleeved onto the needle 30 in a way that the two guiding sheets 423 are moved relative to and along the two reinforcing ribs 36, respectively. In this way, when the lower non-spring section 42 is sleeved onto the stopping block 322, the two slots 422 will be self-aligned with the two engagement ribs 322a respectively, such that the stopping block 322 will be easily engaged into the two slots 422. Besides, each reinforcing rib 36 has a plane 362 facing the guiding sheet 423 of the lower non-spring section 42, so that each guiding sheet 423 can be fixed by welding to the plane 362 of the reinforcing rib 36 corresponding in position to said guiding sheet. In this way, the lower non-spring section 42 is fixed to the needle 30 conveniently and stably.

In fact, as long as each reinforcing rib 36 has at least a part located at the stopping block 322, it is effective in aligning the two slots to the two engagement ribs. However, such reinforcing rib 36 in this embodiment, which is extended from the stopping block 322 to the upper end portion 312 of the body 31, is more effective in aligning the two slots to the two engagement ribs, thereby facilitating the assembling of the spring probe. Besides, the contact between the needle 30 and the spring sleeve 40 is improved by the reinforcing ribs 36, resulting in higher stability in the signal transmission between the needle 30 and the spring sleeve 40. Particularly, in the case that each reinforcing rib 36 has at least a part located at the upper end portion 312 of the body 31, the signal transmission between the needle 30 and the spring sleeve 40 will mostly occur between the upper end portion 312 of the body 31 and the upper non-spring section 41, resulting in higher stability in the signal transmission.

Figure 8:
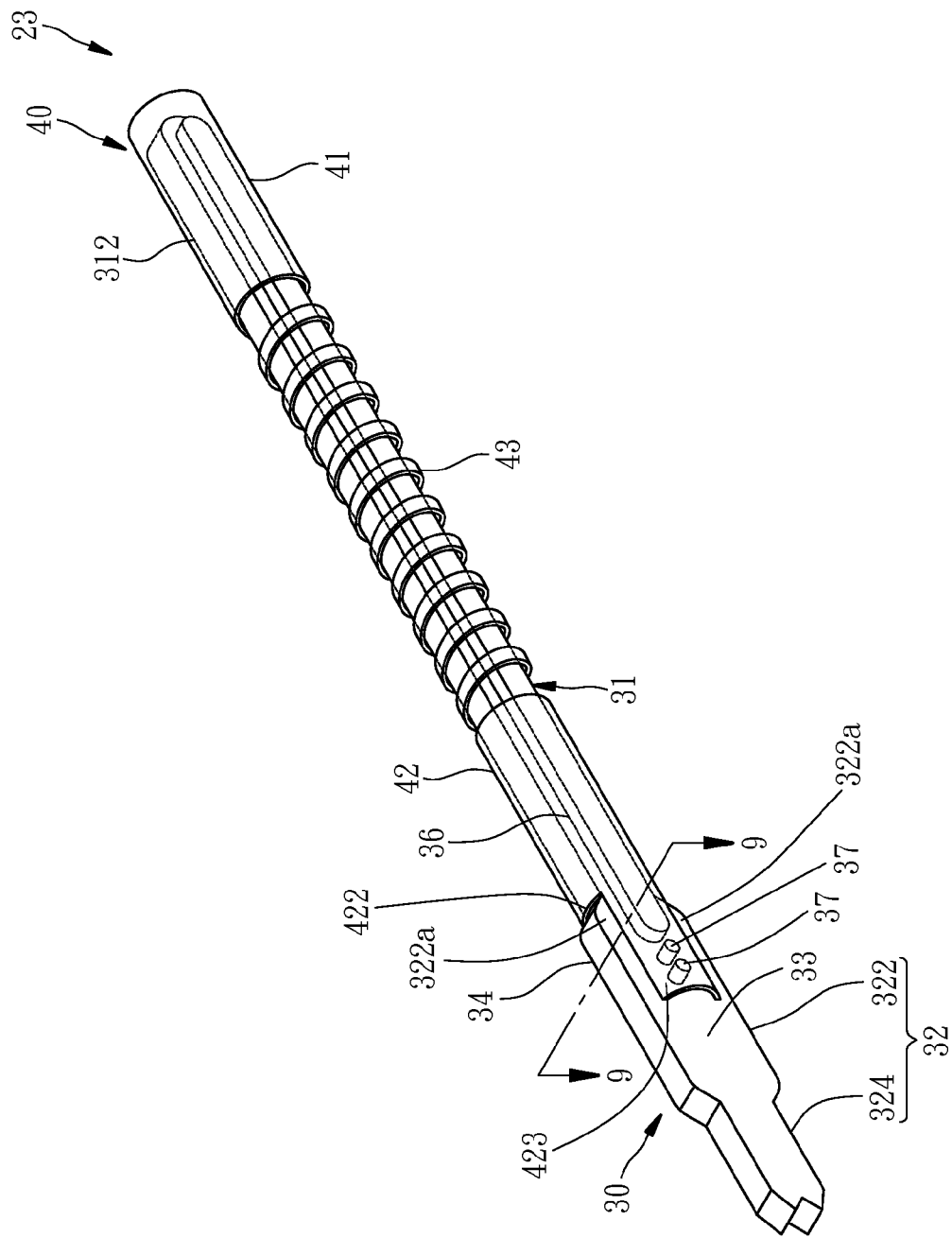
FIG. 8 is an assembled perspective view of a spring probe according to a third preferred embodiment of the present invention.
Figure 9:
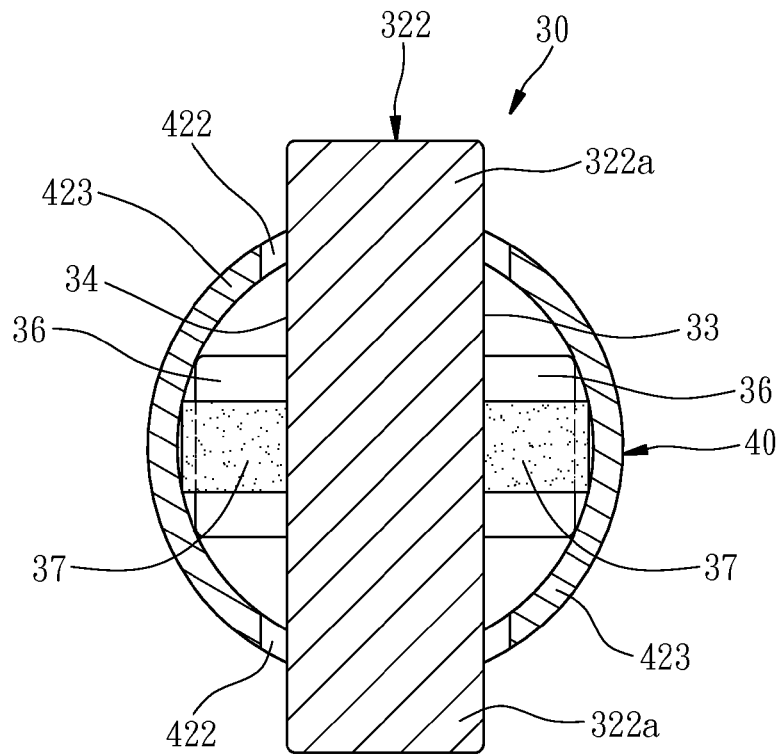
FIG. 9 is a sectional view taken along the line 9-9 in FIG. 8.
Figure 10:
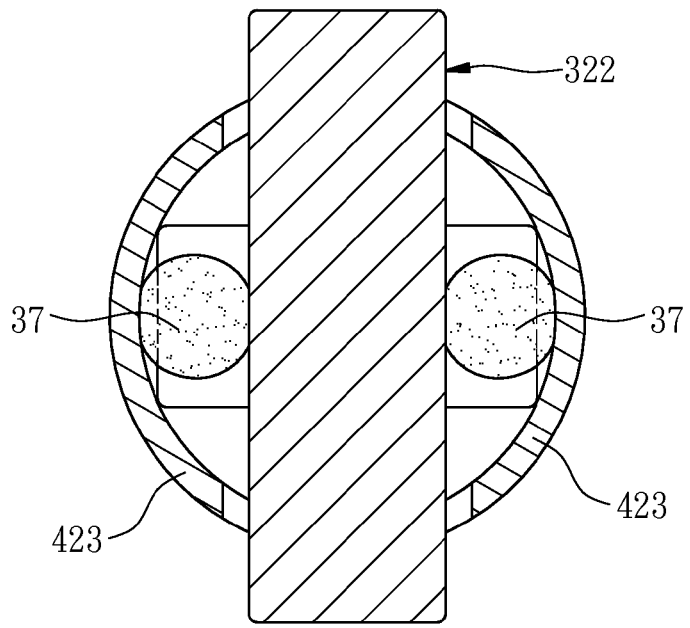
FIG. 10 is similar to FIG. 9, but showing the status of the spring probe after reflow soldering bonding pads of a needle of the spring probe.

Referring to FIGS. 8-10, a spring probe 23 according to a third preferred embodiment of the present invention is configured similar to the aforesaid probe 22, except that the needle 30 and the lower non-spring section 42 of the spring sleeve 40 are welded together by means of a plurality of bonding pads 37. Specifically speaking, the method for manufacturing the spring probe 23 comprises the following steps.

a) As mentioned in the first preferred embodiment, process a circular metal pipe by photolithography technique to form a spring sleeve 40 in a way that the spring sleeve 40 has an upper non-spring section 41, a lower non-spring section 42, and at least one spring section 43 located between the upper and lower non-spring sections 41, 42. Meanwhile, the lower non-spring section 42 is formed with two slots 422 opened at the bottom end 421 thereof, and two guiding sheets 423 adjacent to the two slots 422. That is, the spring sleeve 40 in this embodiment is the same with that in the aforesaid second preferred embodiment.

b) As mentioned in the first preferred embodiment, manufacture a needle 30 by MEMS manufacturing process to provide the needle 30 with not only the aforesaid body 31 and head 32, but also the bonding pads 37 which are protruded outwardly relative to the body 31 and located at the stopping block 322. Specifically speaking, the bonding pads 37 are made of electricity-conductive material different from that of the body 31 and the head 32 and provided at the front and rear surfaces 33, 34 during the process of manufacturing the needle 30. The body 31 and the head 32 can be made of metal with relatively higher electricity-conductivity, and the bonding pads 37 can be made of metal with relatively lower melting point.

c) As mentioned in the first preferred embodiment, position the spring sleeve 40 at the needle 30 in a way that the spring sleeve 40 is sleeved onto the needle 30, the body 31 of the needle 30 is located inside the spring sleeve 40, and the head 32 of the needle 30 is protruded out of the spring sleeve 40 from the lower non-spring section 42. In addition, as mentioned in the second preferred embodiment, the engagement ribs 322a of the stopping block 322 are engaged in the slots 422 of the lower non-spring section 42 and abutted against the lower non-spring section 42.

d) Fix the needle 30 and the guiding sheets 423 of the lower non-spring section 42 together by reflow soldering the bonding pads 37. In other words, the traditional spot welding process is replaced by the reflow soldering of the bonding pads 37 in this embodiment, so that the spring probe 23 can be made by mass production with a saving manufacturing time. When using the traditional spot welding process, the step of pressing the lower non-spring section 42 against the needle 30 and welding them together must be performed for one spring probe at a time, resulting in difficulties in mass production and longer manufacturing time than that of this embodiment.

It is to be mentioned that the needle of the spring probe of the present invention is not limited to be shaped as an elongated rectangular column as mentioned in the aforesaid embodiments. As long as the head of the needle has the stopping block, against which the lower non-spring section of the spring sleeve can be abutted, the spring sleeve can be stably positioned at the needle, such that the spring probe is time-saving and convenient in assembling. Therefore, the stopping block of the needle of the present invention is not limited to have two engagement ribs at two opposite positions, and the lower non-spring section of the spring sleeve is not limited to have two slots at two opposite positions. As long as the stopping block of the needle has at least one engagement rib protruded outwardly relative to the body and the lower non-spring section of the spring sleeve has at least one slot for receiving the engagement rib of the stopping block therein, the spring sleeve can be more stably positioned at the needle. Besides, the amount of the guiding sheet of the lower non-spring section depends on the amount of the slot, and the amount of the reinforcing rib of the needle corresponds to the amount of the guiding sheet. As long as at least one guiding sheet and at least one reinforcing rib are provided, positioning and welding can be conveniently performed. In the case of using the reflow soldering of the bonding pads, the amount of the bonding pad of the needle depends on the amount of the guiding sheet. As long as at least one guiding sheet and at least one bonding pad are provided and able to be bonded together by reflow soldering, the fixing step can be conveniently performed and the time for manufacturing the spring probe can be saved effectively.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A spring probe comprising:
   a spring sleeve having an upper non-spring section, a lower non-spring section, and at least one spring section located between the upper non-spring section and the lower non-spring section; and
   a needle having a body located inside the spring sleeve, and a head protruded out of the spring sleeve from the lower non-spring section and having a stopping block; the lower non-spring section of the spring sleeve being abutted against and fixed to the stopping block,
   wherein the needle is an elongated rectangular column and provided with a front surface, a rear surface, and two side surfaces which are narrower than the front surface and the rear surface; the stopping block is protruded at the two side surfaces, and
   wherein the lower non-spring section of the spring sleeve has a bottom end, and two slots opened at the bottom end; the stopping block of the needle is engaged in the two slots.

2. The spring probe as claimed in claim 1, wherein the lower non-spring section of the spring sleeve has two guiding sheets adjacent to the two slots; the needle is provided with two reinforcing ribs at the front surface and the rear surface respectively; at least a part of each of the reinforcing ribs is located at the stopping block; the two guiding sheets are positioned correspondingly to the two reinforcing ribs, respectively.

3. The spring probe as claimed in claim 2, wherein the body of the needle has an upper end portion located inside the upper non-spring section of the spring sleeve; the reinforcing ribs of the needle are extended from the stopping block to the upper end portion of the body.

4. The spring probe as claimed in claim 2, wherein each of the guiding sheets of the lower non-spring section is fixed by welding to a plane of the reinforcing rib corresponding in position thereto.

5. The spring probe as claimed in claim 1, wherein the lower non-spring section of the spring sleeve has two guiding sheets adjacent to the two slots; the needle is provided at the front surface and the rear surface with a plurality of bonding pads which are located at the stopping block; the needle and the two guiding sheets are fixed together by the bonding pads.

6. The spring probe as claimed in claim 1, wherein the body of the needle has an upper end portion located inside the upper non-spring section of the spring sleeve; the needle is provided with two reinforcing ribs at the front surface and the rear surface respectively; at least a part of each of the reinforcing ribs is located at the upper end portion of the body.

7. The spring probe as claimed in claim 1, wherein the body of the needle has an upper end portion located inside the upper non-spring section of the spring sleeve; the needle is provided with at least one reinforcing rib which is protruded outwardly relative to the body and has at least a part located at the upper end portion of the body.

8. The spring probe as claimed in claim 1, wherein the spring sleeve is formed from a circular metal pipe with a uniform diameter.

9. A spring probe comprising:
a spring sleeve having an upper non-spring section, a lower non-spring section, and at least one spring section located between the upper non-spring section and the lower non-spring section; and
a needle having a body located inside the spring sleeve, and a head protruded out of the spring sleeve from the lower non-spring section and having a stopping block; the lower non-spring section of the spring sleeve being abutted against and fixed to the stopping block,
wherein the stopping block of the needle has at least one engagement rib protruded outwardly relative to the body; the lower non-spring section of the spring sleeve has a bottom end, and at least one slot opened at the bottom end; the at least one engagement rib of the stopping block is engaged in the at least one slot of the lower non-spring section.

10. The spring probe as claimed in claim 9, wherein the lower non-spring section of the spring sleeve has at least one guiding sheet adjacent to the at least one slot; the needle is provided with at least one reinforcing rib which is protruded outwardly relative to the body and has at least a part located at the stopping block; the at least one guiding sheet of the lower non-spring section is positioned correspondingly to the at least one reinforcing rib of the needle.

11. The spring probe as claimed in claim 10, wherein the body of the needle has an upper end portion located inside the upper non-spring section of the spring sleeve; the at least one reinforcing rib of the needle is extended from the stopping block to the upper end portion of the body.

12. The spring probe as claimed in claim 10, wherein the at least one guiding sheet of the lower non-spring section is fixed by welding to a plane of the at least one reinforcing rib.

13. The spring probe as claimed in claim 9, wherein the lower non-spring section of the spring sleeve has at least one guiding sheet adjacent to the slot; the needle is provided with at least one bonding pad which is protruded outwardly relative to the body and located at the stopping block; the needle and the guiding sheet of the lower non-spring section are fixed together by the at least one bonding pad.

14. The spring probe as claimed in claim 9, wherein the spring sleeve is formed from a circular metal pipe with a uniform diameter.

* * * * *